(12) United States Patent
Rochow

(10) Patent No.: US 6,891,441 B2
(45) Date of Patent: May 10, 2005

(54) EDGE SYNCHRONIZED PHASE-LOCKED LOOP CIRCUIT

(75) Inventor: Gregor Benedikt Rochow, Kennebunk, ME (US)

(73) Assignee: Zoran Corporation, Sunnyvale, CA (US)

( * ) Notice: Subject to any disclaimer, the term of this patent is extended or adjusted under 35 U.S.C. 154(b) by 194 days.

(21) Appl. No.: 10/295,684

(22) Filed: Nov. 15, 2002

(65) Prior Publication Data

US 2004/0095189 A1 May 20, 2004

(51) Int. Cl.⁷ .................................................. H03L 7/00
(52) U.S. Cl. ..................... 331/1 A; 331/16; 327/141; 327/156; 327/159; 375/376
(58) Field of Search ................... 331/1 A, 16; 327/156, 327/159, 141; 375/376

(56) References Cited

U.S. PATENT DOCUMENTS 4,535,306 A     8/1985   Yamaguchi et al.
5,703,539 A  *  12/1997  Gillig et al. .................. 331/16
6,326,826 B1   12/2001   Lee et al.
6,819,729 B2   11/2004   Takagi

FOREIGN PATENT DOCUMENTS

EP            490178           6/1992

* cited by examiner

*Primary Examiner*—Arnold Kinkead
(74) *Attorney, Agent, or Firm*—Lahive & Cockfield, LLP

(57) ABSTRACT

A phase-locked loop circuit for synchronizing an edge of an output signal with an edge of an input signal. The circuit detects an edge of an input clock signal, and a corresponding edge on an output signal. If the output signal edge is out of phase with the input clock edge, the circuit shifts the output signal by 180 degrees to effectively produce a single double-length clock phase. The synchronized phase-locked loop circuit provides predictable phase-locked loop output phase synchronization with an input clock.

20 Claims, 2 Drawing Sheets

EDGE SYNCHRONIZED PHASE-LOCKED LOOP CIRCUIT

FIELD OF THE INVENTION

The present invention relates to phase-locked loop circuits. More particularly, the present relates to a phase-locked loop circuit that multiplies the external clock frequency of a circuit for internal use.

BACKGROUND OF THE INVENTION

A phase-locked loop is an electronic circuit that controls an oscillator in order to lock the phase of an output signal to the phase of a reference signal. Generally, a phase-locked loop (PLL) feedback system includes a voltage-controlled oscillator and a phase comparator. The oscillator frequency (or phase) accurately tracks the frequency of an input signal, or an integer multiple of the frequency of the input signal.

A phase-locked loop circuit can be used to generate a stable high frequency output signal from a fixed low-frequency signal. The phase-locked loop circuit generates an output signal that is a multiple of the input signal by using a frequency divider in the feedback stage of the loop. The frequency divider divides the output signal from the oscillator before feeding the signal to the phase comparator. When the circuit is in a "locked" state, the output signal has a frequency that is an integer multiple of the frequency of the input signal. After the frequency divider demultiplies the output signal, the feedback signal fed to the phase comparator has the same frequency as the input signal and the error from the phase comparator is zero. In this manner, the output signal from the phase-locked loop circuit has a frequency that is an integer multiple of the frequency of the input signal.

A problem with conventional phase-locked loop circuits is that the conventional phase-locked loop circuits cannot predict the phase of an output signal without an extended observation. Even though the output frequency of a locked signal is stable relative to the input frequency, the phase of the output signal may be skewed relative to the input signal. A phase-locked loop produces an edge in an output signal when an input signal produces an edge, but the circuit is unpredictable as to whether the corresponding output edge is rising or falling. Observation of the PLL output signal enables other circuitry in a system implementing the PLL to know which phase the PLL-clocked circuit is in, but an actual estimate cannot be made without observation. The unpredictable timing of a phase-locked loop circuit causes difficulty in creating test vectors for automated production testing of an integrated circuit that uses PLL for clocking.

SUMMARY OF THE INVENTION

The present invention provides a phase-locked loop circuit for synchronizing an edge of an output signal with an edge of an input signal. The illustrative embodiment of the present invention detects an edge of an input clock signal, and a corresponding edge on an output signal. If the output signal edge is out of phase with the input clock edge, the circuit shifts the output signal by 180 degrees to effectively produce a single double-length clock phase. The present invention provides a synchronized phase-locked loop circuit that provides predictable PLL output phase synchronization with an input clock.

According to one embodiment, a phase-locked loop circuit for synchronizing an output clock signal with an input clock signal is provided. The phase-locked loop circuit comprises a first detector for detecting a rising edge of the input clock signal, a second detector for detecting a corresponding edge of the output clock signal, and a phase shift controller for shifting the output clock signal by 180 degrees if needed.

According to an alternate embodiment, a method of synchronizing an output clock signal to an input clock signal in a phase-locked loop circuit is provided. The steps for synchronizing comprise detecting an edge of the input clock signal, detecting a corresponding edge of the output clock signal, comparing the corresponding edge to the edge of the input clock signal, determining whether the output clock signal is in phase with the input clock signal, and shifting the output clock signal by 180 degrees if the output clock signal is determined to be out of phase with the input clock signal.

BRIEF DESCRIPTION OF THE DRAWINGS

The foregoing and other features and advantages of the invention will be apparent from the following description and apparent from the accompanying drawings.

DETAILED DESCRIPTION OF THE INVENTION

The illustrative embodiment of the present invention provides a synchronized phase-locked loop circuit that provides predictable output phase synchronization with an input clock. The illustrative embodiment will be described below relative to an illustrative embodiment. Those skilled in the art will appreciate that the present invention is not limited to the illustrative embodiment and may be implemented in a variety of applications.

Figure 1:
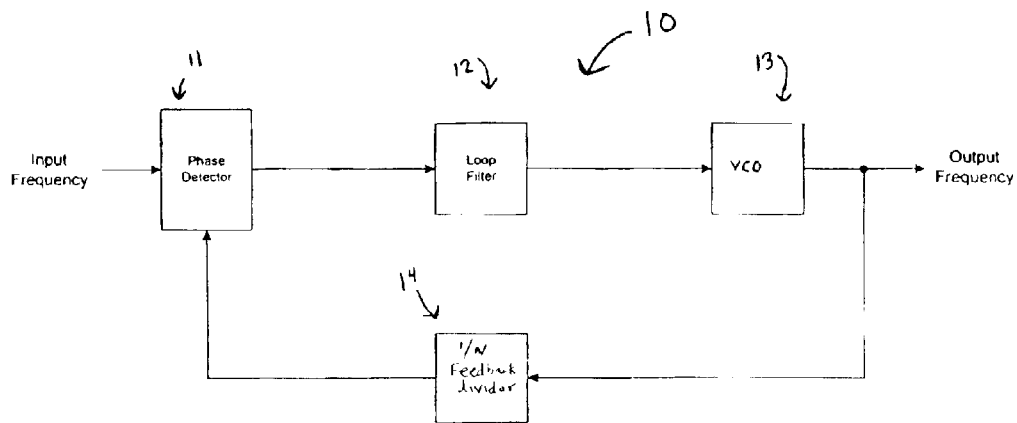
FIG. 1 is a block diagram of a conventional phase-locked loop circuit.

FIG. 1 illustrates a conventional phase-locked loop circuit. The components of the circuit 10 include a phase detector 11, a loop filter 12, a voltage controlled oscillator (VCO) 13, and a feedback divider 14. The VCO is an oscillator having an output frequency that varies with the applied direct current control voltage. When no voltage is applied to the VCO 13, the VCO oscillates at a predetermined default frequency. A portion of the output frequency signal from the VCO 13 is fed back to the error detector, via the frequency divider 14. The frequency divider has a ratio of 1/N, and divides the frequency of the signal from the VCO by a factor of N. The divided down frequency comprises a feedback signal, which is fed to one input of the error detector. The other input to the error detector is the input reference signal having a fixed frequency and phase. The error detector compares the signal from both inputs and outputs an error signal indicative of the difference between the feedback signal from the frequency divider and the input signal. If the error signal is not zero (i.e. the output frequency does not equal N times the input frequency), the error detector outputs source/sink current pulses through the low-pass loop filter 12. The loop filter smoothes the current pulses into a voltage, which in turn drives the VCO 13. The VCO frequency increases or decreases as necessary until the error signal is zero and the loop is locked. In a locked condition, the output frequency is N times the reference frequency. In the described manner, the phase-locked loop circuit 10 generates a high frequency output signal from a low frequency input signal.

Figure 2:
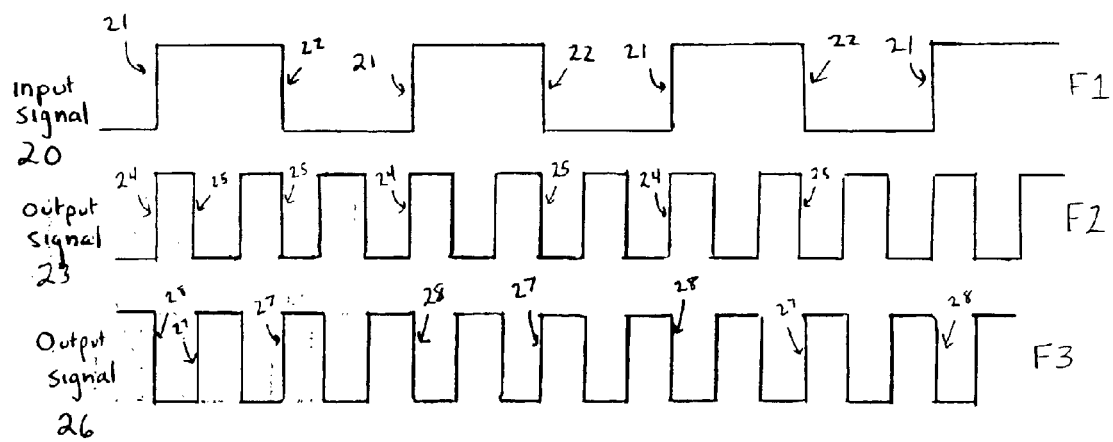
FIG. 2 is a graph of an output signal versus an input signal for a conventional phase-locked loop circuit.

FIG. 2 illustrates a graph of two possible output signals in comparison with an input clock signal for a phase-locked loop producing an output signal having a frequency that is three time the frequency of the input clock signal. As discussed above, a problem with phase-locked loops is that while the loop synchronizes the frequency of an output signal, the circuitry does not always synchronize the phase or edges of an output signal with an input signal. The inability to synchronize the timing of an output signal presents problems to systems utilizing phase-locked loops, particularly for applications where accurate timing is necessary.

An input signal 20 for a phase-locked loop circuit has a first frequency F1. The input signal 20 produces rising edges 21 when the signal switches from a low phase to a high phase. The input signal produces falling edges 22 when the signal switches from a high phase to a low phase. The first output signal 23 is generated by setting the number N to three in the frequency divider 14 of the phase-locked loop circuit of FIG. 1. The first output signal 23 produced by the input signal 20 has a frequency F2, where F2 equals three times the first frequency F1. Output signal 23 is considers to be in alignment with the input signal, because the phase of the output signal 23 corresponds to the phase of the input signal. Output signal 23 includes rising edges 24 and falling edge 25. For an aligned output signal having an output frequency of three times, or another odd multiple of, the input signal, a rising edge in the input signal produces a rising edge in the output signal. A falling edge in the input signal will likewise produce a falling edge in the output signal.

However, phase-locked loops sometimes produce an output signal having a stable frequency relative to the input frequency, but having a misaligned phase. Output signal 26 illustrates an example of a misaligned output signal produced by input signal 20. Similar to output signal 23, output signal 26 has a stable frequency F3 that is three time the frequency F1 of the input signal 20. However, as illustrated misaligned output signal 26 is 180 degrees out of phase with the input signal 20. In other words, the rising edges 21 of the input signal 20 produce falling edges 28 of the misaligned output signal and the falling edges 22 of the input signal 20 produce rising edges 27 of the misaligned output signal 26.

The relationship between an output signal that is an even multiple (2, 4, 6 . . . ) of an input signal is slightly different. A rising edge of an input signal ideally produces a rising edge of an evenly-multiplied output signal. A falling edge of the input signal also ideally produces a rising edge in the evenly-multiplied output signal. When the evenly-multiplied output signal is misaligned with the input signal, the relationship between the edges is reversed.

Figure 3:
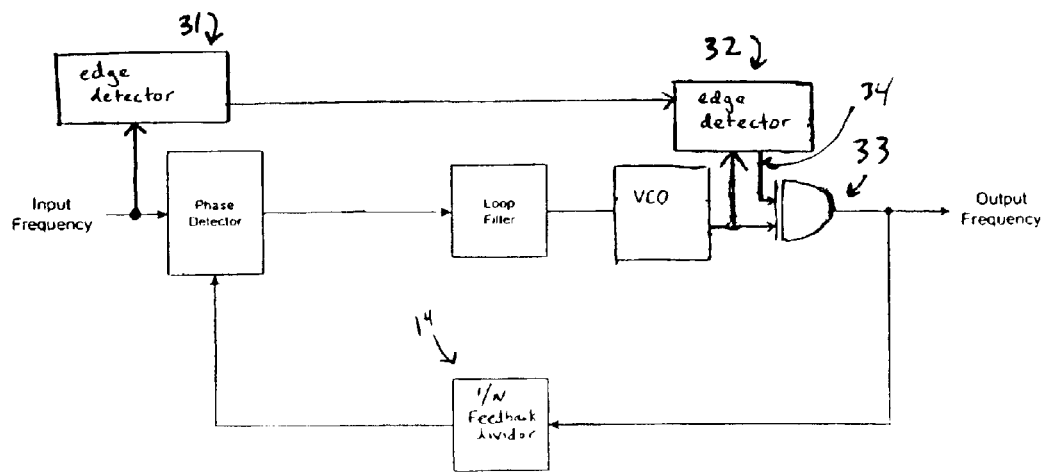
FIG. 3 is a schematic diagram of a phase-locked loop according to the illustrative embodiment of the present invention.

FIG. 3 illustrates a phase-locked loop circuit 30 according to the illustrative embodiment of the invention for synchronizing an output signal with an input signal. The illustrative embodiment includes a first detector 31 for detecting either a rising edge or a falling edge of the input clock signal. A second detector 32 detects a corresponding output edge of the output signal produced by the input clock signal edge. If the output clock edge is of the appropriate type (rising or falling, depending on the nature of the corresponding input edge and the frequency multiple of the output signal), the circuit continues to act as a plain divider, dividing the output signal from the VCO and feeding the divided down signal back to the phase comparator. However, if the corresponding output clock edge is not correct, the circuit shifts the output signal by 180 degrees to align the edges and phase of the output clock signal with the input clock signal.

According to the illustrative embodiment, the output clock signal is passed through an exclusive OR gate 33, which inverts the output signal, if necessary, in order to shift the phase of the output signal by 180 degrees. The decision to make the inversion is triggered by software in the detectors 31, 32. An inversion is made by altering a second input 34 to the exclusive OR gate. The second input 34 is produced by the detector and depends on whether an inversion is necessary. The default input signal from the detector is a low phase signal (0). However, if the detectors 31, 32 determine that an inversion is necessary, the detectors produce a high phase pulse (1) for the duration of one-half the wave period of the output signal (180 degrees). The high phase pulse from the detector 32 automatically inverts output signal for one-half the wave period. Effectively, the inversion produces a single double length clock phase, which shifts the phase of the output signal by 180 degrees to align the phase of the output signal with the phase of the input signal. After the phase-shift is made, the subsequent edges of the output signal will be synchronized to the input signal.

Figure 4:
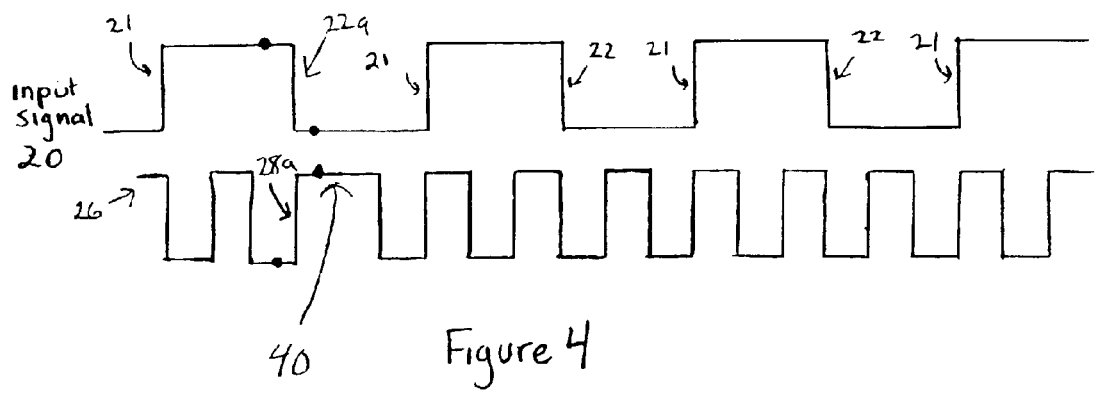
FIG. 4 is a graph illustrating a shift in an output signal to align an output signal with an input signal according to the illustrative embodiment.

FIG. 4 illustrates the shifting of the misaligned output clock signal 26 of FIG. 2 into alignment with the input clock signal 20 according to the illustrative embodiment. As illustrated and discussed, a rising edge 21 of the input signal incorrectly produces a falling edge of the misaligned output signal 26 and a falling edge 22 of the input signal incorrectly produces a rising edge of the misaligned output signal 26 having an output frequency that is three time the frequency of the input signal. The input detector 31 detects a falling edge 22a of input signal 20, and communicates information to the output detector 32, which detects the corresponding edge 28a of the output signal. When the detector software determines that an inversion is necessary, the output signal is inverted to produce double length clock edge 40. As shown, subsequent edges of the output signal are aligned with the input signal.

According to an alternate embodiment, the first edge detector 31 detects a rising edge of the input signal and compare the measurement to a corresponding edge in the output signal.

The software in detectors 31 and 32 generate an appropriate input signal for the exclusive OR gate depending on the measured output signal, as well as the ratio of the frequency of the output signal relative to the input signal (i.e. whether the ration is an odd or even integer).

The illustrated synchronization circuit provides predictable phase-locked loop output phase synchronization with an input clock signal. The illustrative embodiment provides fast, automatic synchronization without affecting the performance of the phase-locked loop circuit or lengthening the time involved in locking an output signal to an input signal. A change in the ratio between the frequency of the input clock signal and frequency of the output clock signal re-establishes synchronization with of the output signal with the input signal after at most one incorrect clock edge.

The present invention has been described by way of example, and modifications and variations of the exemplary embodiments will suggest themselves to skilled artisans in this field without departing from the spirit of the invention. Features and characteristics of the above-described embodiments may be used in combination. The preferred embodiments are merely illustrative and should not be considered restrictive in any way. The scope of the invention is to be measured by the appended claims, rather than the preceding description, and all variations and equivalents that fall within the range of the claims are intended to be embraced therein.

Having described the invention, what is claimed as new and protected by Letters Patent is:

1. A phase-locked loop circuit for synchronizing an output clock signal with an input clock signal, said circuit comprising:
   a first edge detector for detecting an input edge of the input clock signal;
   a second edge detector for detecting a corresponding edge of the output clock signal, said corresponding edge being produced by and simultaneous with the input edge; and
   a phase shift controller for shifting the output clock signal by 180 degrees to produce a single double-length clock phase.

2. The phase-locked loop circuit according to claim 1, wherein the phase shift controller is applied only if the corresponding edge is out of phase with the input edge.

3. The phase-locked loop circuit according to claim 2, wherein the phase shift controller synchronizes the output clock signal with the input clock signal, so that a rising edge of the input clock signal produces a rising edge in the output clock signal.

4. The phase-locked loop circuit according to claim 2, further comprising:
   a voltage controlled oscillator for generating said output clock signal in response to an input voltage;
   a phase detector for comparing said input signal to a feedback signal from said voltage controlled oscillator and generating an error signal; and
   a loop filter for generating said input voltage in response to said error signal.

5. The phase-locked loop circuit according to claim 4, further comprising a frequency divider for dividing said output clock signal from said voltage controlled oscillator to produce said feedback signal.

6. The phase-locked loop circuit according to claim 1, wherein the phase shift controller comprises an exclusive OR gate through which the output clock signal is inverted.

7. The phase-locked loop circuit according to claim 4, wherein:
   a change in the ratio between the frequency of the input clock signal and frequency of the output clock signal re-establishes synchronization of the output signal with the input signal after at most one incorrect clock edge.

8. A method of synchronizing an output clock signal to an input clock signal in a phase-locked loop circuit, said method comprising:
   detecting an edge of the input clock signal;
   detecting a corresponding edge of the output clock signal, said corresponding edge being produced by and occurring simultaneously with the edge of the input clock signal;
   comparing the corresponding edge to the edge of the input clock signal;
   determining whether the output clock signal is in phase with the input clock signal; and
   shifting the output clock signal by 180 degrees if the output clock signal is determined to be out of phase with the input clock signal.

9. A method according to claim 8, wherein the edge of the input clock signal is a rising edge.

10. A method according to claim 8, wherein the edge of the input clock signal is a falling edge.

11. A method according to claim 8, wherein the step of shifting the output clock signal by 180 degrees effectively creates a single double-length clock phase in order to synchronize the output clock signal with the input clock signal.

12. A method according to claim 8, wherein the output clock signal is inverted through an exclusive OR gate in order to shift the signal by 180 degrees.

13. A phase-locked loop circuit for synchronizing an output clock signal with an input clock signal, said circuit comprising:
   a voltage controlled oscillator for generating said output clock signal in response to an input voltage and providing a feedback signal;
   a phase detector for comparing said input signal to the feedback signal and generating an error signal;
   a loop filter for generating said input voltage in response to said error signal;
   a first edge detector for detecting a rising edge of the input clock signal;
   a second edge detector for detecting a corresponding edge of the output clock signal, said corresponding edge being produced by and simultaneous with the rising edge; and
   a phase shift controller for shifting the output clock signal to synchronize a phase of the output clock signal with a phase of the input clock signal.

14. The phase-locked loop circuit of claim 13, wherein said phase-shift controller shifts the output clock signal only if the corresponding edge is falling.

15. The phase-locked loop circuit of claim 13, wherein the phase-shift controller shifts the output clock signal by 180 degrees.

16. The phase-locked loop circuit of claim 13, wherein said phase-shift controller comprises an exclusive OR logic gate.

17. The phase-locked loop circuit of claim 16, wherein said output clock signal is passed through the exclusive OR logic gate.

18. The phase-locked loop circuit of claim 17, wherein said exclusive OR logic gate inverts the output clock signal to synchronize the phase of the output clock signal with the phase of the input clock signal.

19. The phase-locked loop circuit of claim 18, wherein said exclusive OR logic gate inverts the output clock signal if the corresponding edge is falling.

20. The phase-locked loop circuit of claim 13, further comprising a frequency divider for dividing said output clock signal from said voltage controlled oscillator to produce said feedback signal.

* * * * *